(12) United States Patent
Mori et al.

(10) Patent No.: US 9,062,274 B2
(45) Date of Patent: Jun. 23, 2015

(54) LOW FRICTION SLIDING MEMBER

(75) Inventors: Hiroyuki Mori, Nisshin (JP); Munehisa Matsui, Toyota (JP); Toshihide Ohmori, Nagoya (JP); Takatoshi Shinyoshi, Toyota (JP); Yoshio Fuwa, Toyota (JP); Keiji Hayashi, Nagoya (JP)

(73) Assignees: KABUSHIKI KAISHA TOYOTA CHUO KENKYUSHO, Aichi-ken (JP); TOYOTA JIDOSHA KABUSHIKI KAISHA, Toyota (JP)

( * ) Notice: Subject to any disclaimer, the term of this patent is extended or adjusted under 35 U.S.C. 154(b) by 426 days.

(21) Appl. No.: 12/829,809

(22) Filed: Jul. 2, 2010

(65) Prior Publication Data

US 2011/0021390 A1 Jan. 27, 2011

(30) Foreign Application Priority Data

Jul. 3, 2009 (JP) ................................. 2009-158588

(51) Int. Cl.
*C10M 135/00* (2006.01)
*C23C 14/35* (2006.01)
*C10M 163/00* (2006.01)

(52) U.S. Cl.
CPC .............. *C10M 163/00* (2013.01); *C23C 14/35* (2013.01); *C10M 2201/041* (2013.01); *C10M 2203/1006* (2013.01); *C10M 2215/086* (2013.01); *C10M 2215/28* (2013.01); *C10M 2219/046* (2013.01); *C10M 2223/045* (2013.01); *C10N 2230/06* (2013.01); *C10N 2240/10* (2013.01); *C10N 2250/141* (2013.01)

(58) Field of Classification Search
USPC ......................................... 508/105, 109, 110
See application file for complete search history.

(56) References Cited

U.S. PATENT DOCUMENTS

| 4,552,677 A * | 11/1985 | Hopkins ....................... 508/290 |
| 7,368,168 B2 | 5/2008 | Mori et al. |
| 7,537,835 B2 | 5/2009 | Mori et al. |
| 2002/0022129 A1* | 2/2002 | Moronuki ..................... 428/408 |
| 2005/0082139 A1* | 4/2005 | Ishikawa et al. ......... 192/107 M |

FOREIGN PATENT DOCUMENTS

| JP | A-05-208806 | 8/1993 |
| JP | A-2001-316686 | 11/2001 |
| JP | A-2003-336542 | 11/2003 |
| JP | A-2003-534223 | 11/2003 |

(Continued)

OTHER PUBLICATIONS

May 30, 2013 Notification of Reasons for Refusal issued in Japanese Patent Application No. 2010-151579 (with English Translation).

*Primary Examiner* — James Goloboy
(74) *Attorney, Agent, or Firm* — Oliff PLC

(57) ABSTRACT

The low friction sliding member includes a substrate and an amorphous hard carbon film formed on the surface of the substrate and makes sliding contact with a mating member under a wet oiling condition. The lubricant oil includes at least one of sulfur (S) and phosphorus (P) and at least one of zinc (Zn), calcium (Ca), magnesium (Mg), sodium (Na), barium (Ba) and copper (Cu). The amorphous hard carbon film comprises carbon (C) as a major component, and hydrogen (H) in the range from 5 to 25 atomic % and a predetermined amount of boron (B), aluminum (Al), manganese (Mn) or molybdenum (Mo) assuming that the total atomic % of the amorphous carbon film is 100.

5 Claims, 10 Drawing Sheets

(56) References Cited

FOREIGN PATENT DOCUMENTS

| JP | A-2004-115826 | 4/2004 |
| JP | A-2005-060416 | 3/2005 |
| JP | A-2005-256868 | 9/2005 |
| JP | A-2005-336456 | 12/2005 |
| JP | 2007099949 A * | 4/2007 |
| JP | A-2007-099949 | 4/2007 |
| WO | WO 01/90016 A1 | 11/2001 |

* cited by examiner

13 (6.3Ti-DLC)

| Distance [1/nm] | interplanar spacing d[Å] | Graphite-2H (PDF#41-1487) | | | TiC(PDF#32-1383) | | | |
|---|---|---|---|---|---|---|---|---|
| | | d(Å) | h | k | l | d(Å) | h k l | |
| 2.803 | 3.57 | 3.375 | 0 | 0 | 2 | | | |
| 4.072 | 2.46 | | | | | 2.499 | 1 1 1 | |
| 4.601 | 2.17 | | | | | 2.163 | 2 0 0 | |
| 6.452 | 1.55 | | | | | 1.53 | 2 2 0 | |

00 (DLC)

US 9,062,274 B2

LOW FRICTION SLIDING MEMBER

CROSS REFERENCE TO RELATED APPLICATIONS

This application claims priority under 35 U.S.C. Sec. 119 to No. 2009-158588 filed in Japan on Jul. 3, 2009 the entire content of which is herein incorporated by reference

FIELD OF THE INVENTION

This invention relates to a low friction sliding member used under a wet condition that lubricant oil is used.

BACKGROUND OF THE INVENTION

Considering the resources conservation and environmental issues, it is required for a sliding member, such as an engine piston or a component used for valve system to reduce frictionally-induced energy losses. For this reason, various surface treatments have been conducted hitherto on the sliding surface of the sliding member to reduce the value of coefficient of friction thereof or to improve wear resistance. Among them, an amorphous hard carbon film called diamond-like carbon (hereinafter called, DLC) is widely used as a film which can improve sliding property on the sliding surface.

In Patent Publication 1 (JP2005-336456 A), a low friction sliding member is disclosed, which includes DLC-Si (Diamond-like carbon containing Silicon) film. Such DLC-Si film, when applied under a wet oiling condition that lubricant oil containing additive agent, such as engine oil, is used can not sufficiently express low friction property. However, when water exists in the engine oil, an adsorbed water layer is formed on the DLC-Si film via silanol layer (Si—OH layer). This adsorbed water layer reduces the coefficient of friction.

Another sliding member is developed, which includes a DLC film containing a metal element instead of containing silicon. For example, in Patent Documents 2, 3 and 4, a (listed below) sliding member which includes a DLC film containing Ti (titanium), Cr (chromium), Mn (manganese), Fe (iron), Ni (nickel), Zn (zinc), Ga (gallium), Nb (niobium), Mo (molybdenum) or W (tungsten) is disclosed. The sliding member including a DLC film forms an additive layer on the surface of the DLC film to achieve low coefficient of friction by sliding in the lubricant oil containing such additive.

LIST OF PATENT DOCUMENT

Patent document 1: JP 2005-336456 A
Patent document 2: JP 2001-316686 A
Patent document 3: JP 2004-115826 A
Patent document 4: JP 2005-256868 A As explained above, the sliding member including a DLC film in which a metal element is added slides in the lubricant oil containing additive agent. For example, according to an example of the Patent Document 2, a sliding member in Example 1 thereof including a DLC film containing 27 atomic % Mo (molybdenum) and a sliding member in Example 7 including a DLC film containing 40 atomic % Mo (molybdenum) respectively slide in the lubricant oil. Both sliding members according to the Examples 1 and 7 express low coefficient of friction when they are sliding in the lubricant oil formed by adding MoDTC (molybdenum dithiocarbamate) to mineral oil, in other words, in the lubricant oil containing molybdenum (Mo). However, when the sliding member slides in conventional engine oil containing no molybdenum, the coefficient of friction increases to a value higher than that in the case where the sliding member slides in the lubricant oil containing molybdenum (See table 1 of the specification of Patent Document 2). Further, in the Patent Document 3, the lubricant oil containing molybdenum dithiocarbamate is used. In other words, in order to reduce the coefficient of friction of a conventional sliding member having a DLC film containing a metal element, it is essential to use in the lubricant oil containing molybdenum. However, use of molybdenum which is a heavy metal may cause the environmental issues. Thus, it is required to develop a sliding member having a low friction of coefficient used in lubricant oil containing no molybdenum.

In other words, need thus exists for a low friction sliding member indicating a low coefficient of friction used in a lubricant oil containing no molybdenum. It is therefore, an object of the invention to provide a low friction sliding member having a low coefficient of friction in the lubricant oil containing no molybdenum.

SUMMARY OF THE INVENTION

The inventors of this application devoted themselves to the study on coefficient of friction of sliding members having various types of DLC films containing active (or easy to be oxidized) elements by using lubricant oil containing no molybdenum. The results of the study indicated that among the sliding members having DLC film containing semiconductor element, such as silicon, or a metal element, the number of sliding member used in the base oil containing no additives expressing low coefficient of friction is rather larger than the number of sliding member used in the engine oil containing additives except molybdenum. However, the value itself of the coefficient of friction of the sliding members used in the base oil was not satisfactory and the inventors further studied and found that depending on the element added to the DLC film, even used in the engine oil containing no molybdenum, the value of coefficient of friction indicates lower than the case used in the base oil. Finally the inventors made various inventions as described hereinafter by developing the above knowledge obtained by the studies.

According to an aspect of the invention, the low friction sliding member used under a wet condition that a lubricant oil free from molybdenum is used, comprises a substrate and an amorphous hard carbon film formed on the substrate and in sliding contact with a mating material, wherein the sliding member is characterized in that the lubricant oil contains more than 500 ppm in total of at least one of sulfur (S) and phosphorus (P) and at least one of zinc (Zn), calcium (Ca), magnesium (Mg), sodium (Na), barium (Ba) and copper (Cu) and that the amorphous hard carbon film comprises carbon (C) as a major component, and hydrogen (H) in the range from five (5) atomic % or more to twenty-five (25) atomic % or less and boron (B) in the range from four (4) atomic % or more to thirty (30) atomic % or less, assuming that the entire amorphous hard carbon film is hundred (100) atomic %.

According to another aspect of the invention, the low friction sliding member having the amorphous hard carbon film is characterized in that the amorphous hard carbon film comprises carbon (C) as a major component, and hydrogen (H) in the range from five (5) atomic % or more to twenty-five (25) atomic % or less and aluminum (Al) in the range from seven (7) atomic % or more to twenty (20) atomic % ore less, assuming that the entire amorphous hard carbon film is hundred (100) atomic %.

According to still another aspect of the invention, the low friction sliding member having the amorphous hard carbon film is characterized in that the amorphous hard carbon film comprises carbon (C) as a major component, and hydrogen (H) in the range from five (5) atomic % or more to twenty-five (25) atomic % or less and manganese (Mn) in the range from five (5) atomic % or more to twenty (20) atomic % or less, assuming that the entire amorphous hard carbon film is hundred (100) atomic %.

According to further aspect of the invention, the low friction sliding member having the amorphous hard carbon film is characterized in that the amorphous hard carbon film comprises carbon (C) as a major component, and hydrogen (H) in the range from five (5) atomic % or more to twenty-five (25) atomic % or less and molybdenum (Mo) in the range from seven (7) atomic % or more to twenty (20) atomic % or less of, assuming that the entire amorphous hard carbon film is hundred (100) atomic %.

The low friction sliding member according to the invention is characterized in that the friction is greatly reduced under a wet condition using a lubricant oil containing at least one of sulfur (S) and phosphorus (P) and at least one of zinc (Zn), calcium (Ca), magnesium (Mg), sodium (Na), barium (Ba) and copper (Cu), but no molybdenum (Mo) being contained. This reduction of friction is presumed to be achieved by a boundary layer formed on a surface of the amorphous carbon film containing a predetermined value of boron (B), aluminum (Al), manganese (Mn) or molybdenum (Mo) by selective adsorbing or reacting of ions mostly of negative ions generated by dissociation of additive agent containing sulfur (S), phosphorus (P) and other included in the lubricant oil. Further, according to the invention, since the low friction sliding member includes DLC film comprises 5 to 25 atomic % hydrogen, not only the low friction property but also the wear resistance can be improved thereby to keep the low friction for a long time period.

It is noted here that in the specification of this invention, the adsorption of ions formed by dissociation of additive agent contained in the lubricant oil on the film surface or the reaction of the ions on the film surface may be described "adsorb or adsorption" in general and the adsorbed ions may be described as "adsorbed substance" in abbreviate manner.

According to the invention, the low friction sliding member preferably includes less than six (6) atomic % oxygen and more preferably less than three (3) atomic % thereby to effectively achieve low friction effects.

BRIEF EXPLANATION OF ATTACHED DRAWINGS

This application contains at least one drawing executed in color.

The foregoing and additional features and characteristics of this disclosure will become more apparent from the following detailed description considered with the reference to the accompanying drawings, wherein:

FIG. 1 indicates an outline of block-on-ring type friction test machine;

Figure 17:
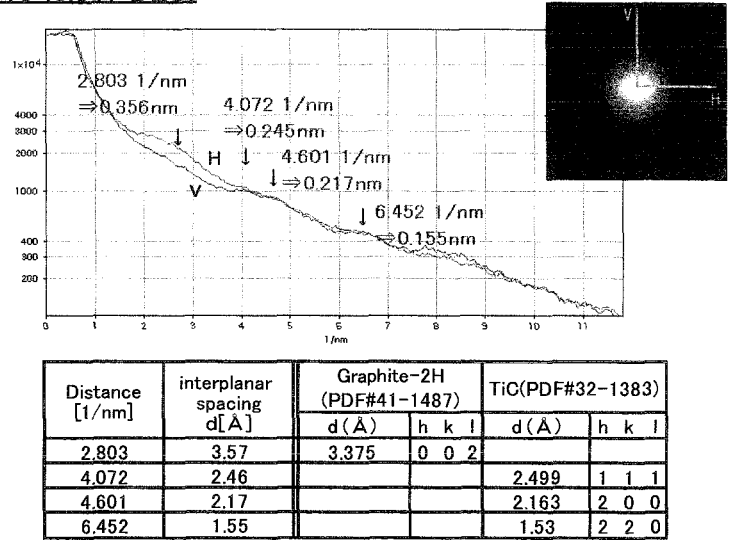
Figure 18:
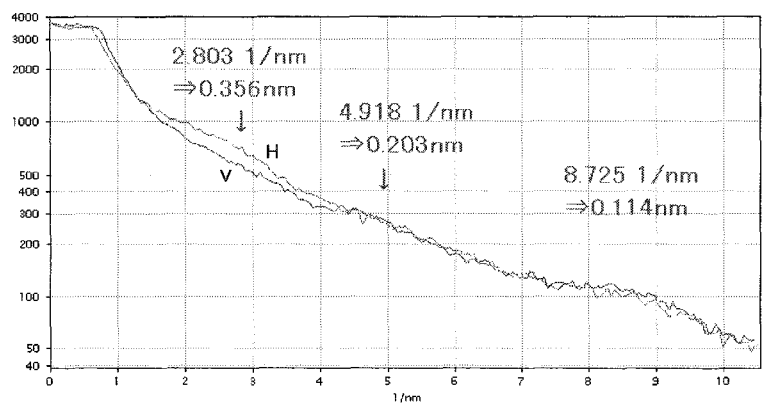

FIG. 17 shows an electron beam diffraction image obtained by TEM observing the cross section of the sliding member having DLC film containing titanium and a graph showing the analysis result thereof; and, FIG. 18 shows an electron beam diffraction image obtained by TEM observing the cross section of the sliding member having DLC film containing no additive element and a graph showing the analysis result thereof.

THE BEST MODE OF THE INVENTION

The best mode of the low friction sliding member according to the present invention will be explained hereinafter in detail. It is noted here that unless otherwise defined, the numerical range "from x to y" means between x and y including the lower limit value x and the upper limit value y. The numerical range can be freely defined by combining these upper and lower limit numerical values and numerical values described in the embodiments.

The low friction sliding member according to the present invention is used under a wet condition using lubricant oil which is free from molybdenum element, and the sliding member includes a substrate and an amorphous hard carbon film (DLC film) formed on a surface of the substrate and in sliding contact with a mating member. Hereinafter, the substrate, the amorphous carbon film and the lubricant oil will be explained.

<Substrate>

The material of the substrate is not limited to any particular substance and any material can be used as long as it is applicable to be used as a sliding member. For example, metal substrate, such as carbon steel, alloy steel, cast iron, aluminum alloy, titanium alloy or ceramic substrate such as cemented carbide, alumina, silicon nitride, or resin substrate such as polyimide or polyamide can be applicable to the substrate invention.

As to the surface roughness of the substrate, at least at the surface where the DLC film is formed, it is preferable to be the value of 0.1 μm or less, more preferably 0.04 μm or less or still more preferably, 0.01 μm or less measured according to the arithmetic average roughness (RA) defined in JIS (Japan Industrial Standard). Further, from the point of adhesion with DLC film, the substrate may be provided with an intermediate layer at the surface.

The mating member, with which the amorphous hard carbon film is to be in sliding contact, is preferably made of metal, such as carbon steel, alloy steel, cast iron, aluminum alloy, titanium alloy or ceramic material such as cemented carbide, alumina, silicon nitride, or resin material such as polyimide or polyamide. It is preferable to provide a film, similar to the DLC film, which will be explained in detail at the surface of the mating member in order to further reduce the coefficient of friction.

<Amorphous Carbon Film>

The DLC film comprises carbon (C) as a major component and hydrogen (H), and further includes boron (B), aluminum (Al), manganese (Mn) or molybdenum (Mo). The DLC film containing these elements is preferable to structure the DLC film as a whole to be amorphous, however these elements may react with the carbon to form carbide.

It is preferable for the low friction sliding member of the present invention to provide a DLC film, which is substantially free from carbide. Particularly, since boron, aluminum or manganese is an element difficult to form carbide, it may be possible to form a DLC film which substantially does not contain carbide depending on the film forming conditions of the DLC film. Ions in the lubricant oil are easy to be adsorbed or react with the carbide and accordingly, if the carbide exists in the DLC film, the carbide may prevent forming of uniform boundary layer on the surface of the DLC film. Accordingly, it is not preferable to have the DLC film containing carbide. Further, it is preferable to have the DLC film having a low orientation. The DLC film without orientation may generate a good boundary layer by uniformly adsorbing the ionized additive agent in the lubricant oil on the film surface.

It should be noted here that the phrase "substantially free from carbide" means that a peak indicating the existence of carbide is not found from the X-ray diffraction of the DLC film or means that the spot or ring which indicates the existence of carbide is not found from the electron beam diffraction image obtained by TEM (transmission electron microscope). Or, it means that carbide is not detected in TEM images, observed high-magnification, ×1,500,000 or more on DLC film by high-resolution-power TEM. Further, the phrase "low orientation" used in this specification means that diffraction ring which belongs to the graphite (002) plane in the electron beam diffraction image becomes substantially true circle. It is difficult to define the orientation quantitatively, however, when comparing the various DLC films deposited by sputtering method with the DLC film contained in the low friction sliding member according to the present invention, it is preferable that the DLC film of the present invention has a lower orientation than the (002) plane orientation indicated by the other DLC film substantially composed of carbon and hydrogen the DLC film can be said to be low in orientation.

However, if the DLC film contained in the low friction sliding member according to the present invention includes molybdenum (Mo), it is preferable to have the DLC film containing the molybdenum carbide (MoC). Negative ions preferentially exist on the surface of the film upon sliding movement as does the DLC film containing boron (B), aluminum (Al), or manganese (Mn). The study of the inventors of this application revealed that the boundary layer formed on the surface of the film upon sliding movement is the molybdenum sulfide ($MoS_2$) film. The mechanism is presumed that among the negative ions existing on the surface of the DLC film containing molybdenum, $S^-$ adsorbed to the molybdenum carbide (MoC) reacts to form the molybdenum sulfide ($MoS_2$) film. The molybdenum sulfide ($MoS_2$) film is a lubricant film having layered structure and accordingly has the effect on the reduction of friction.

Boron contained amount is in the range from 4 to 30 atomic % assuming that the entire DLC film is 100 atomic %. If the boron amount is less than 4 atomic %, since the selective adsorption of negative ions is hardly made, low friction cannot be achieved when using the lubricant oil which does not contain molybdenum (Mo). This will be later explained in detail. It is difficult to form a DLC film having the boron contained amount of more than 30 atomic %. Accordingly, it is practical to have the boron contained amount of 20 atomic % or less, or further practical to have the amount thereof to be equal to or less than 15 atomic %. Appropriate boron contained amount is from 4 to 14 atomic %, or more preferably, from 4.2 to 12.3 atomic %.

Aluminum contained amount is in the range from 7 to 20 atomic % assuming that the entire DLC film is 100 atomic %. If the aluminum amount is less than 7 atomic %, since the selective adsorption of negative ions is hardly made, low friction cannot be achieved when using the lubricant oil which does not contain molybdenum (Mo). This will be also explained in detail after. If the aluminum contained amount exceeds 20 atomic %, not only the low friction cannot be achieved when using the lubricant oil which does not contain molybdenum (Mo), but also the hardness of the DLC film is reduced, and accordingly, the wear resistance drops. Accordingly, it is appropriate to have the aluminum contained amount in the range from 10 to 18 atomic %, or from 12 to 15 atomic % or further appropriate to have the amount in the range from 13.7 to 14.1 atomic %.

Manganese contained amount is in the range from 5 to 20 atomic % assuming that the entire DLC film is 100 atomic %. If the aluminum amount is less than 5 atomic %, since the selective adsorption of negative ions is hardly made, low friction cannot be achieved when using the lubricant oil which does not contain molybdenum (Mo). This will be also explained in detail after. If the manganese contained amount exceeds 20 atomic %, not only the low friction cannot be achieved when using the lubricant oil which does not contain molybdenum (Mo), but also the hardness of the DLC film is reduced, and accordingly, the wear resistance drops. Accordingly, it is appropriate to have the manganese contained amount in the range from 7 to 18 atomic % or from 10 to 15 atomic % or further appropriate to have the amount in the range from 13.5 to 13.9 atomic %.

Molybdenum contained amount is in the range from 7 to 20 atomic % assuming that the entire DLC film is 100 atomic %. If the molybdenum amount is less than 7 atomic %, since the carbide is insufficient and accordingly the $MoS_2$ film is not sufficiently formed, low friction cannot be achieved when using the lubricant oil which does not contain molybdenum (Mo). This will be also explained in detail after. If the molybdenum contained amount exceeds 20 atomic %, the containing ratio of the carbide increases and positive ions in the lubricant oil are also adsorbed, and therefore, the low friction cannot be achieved when using the lubricant oil which does not contain molybdenum (Mo). Accordingly, it is appropriate to have the molybdenum contained amount in the range from 8 to 15 atomic % or from 9 to 13 atomic % or further appropriate to have the amount in the range from 10.5 to 10.9 atomic %.

The DLC film containing boron, aluminum, manganese, or molybdenum may also contain other semiconductor substances and metal elements for the purpose of assuring property, such as wear resistance, anti-corrosion or heat resistance. Such substances or elements are either boron (B), aluminum (Al), manganese (Mn), molybdenum (Mo), silicon (Si), titanium (Ti), chromium (Cr), tungsten (W), nickel (Ni) or vanadium (V). However, the containable amount of these additive elements is limited to a particular amount, i.e., less than eight (8) atomic % or further limited to be less than four (4) atomic %, in order not to influence on the friction reduction effect expressed by boron, aluminum, manganese or molybdenum.

Hydrogen (H) contained amount is in the range from 5 to 25 atomic % assuming that the entire DLC film is 100 atomic %. Smaller the hydrogen contained amount, harder the DLC film becomes. If the hydrogen amount is less than 5 atomic %, adhesion strength between the DLC film and the substrate and the toughness of the DLC film drop. Accordingly, it is appropriate to set the hydrogen contained amount to be equal to or more than 8 atomic % or further appropriate to set the amount equal to or more than 10 atomic %. If the hydrogen contained amount exceeds 25 atomic %, the hardness of the DLC film becomes soft and the wear resistance drops. Accordingly, it is appropriate to set the hydrogen contained amount to be equal to or less than 23 atomic % or further appropriate to set the amount equal to or less than 21 atomic %.

Oxygen (O) may be included in the DLC film. The oxygen contained amount may be preferably set to be less than 6 atomic % or further limited to be less than 3 atomic %, assuming that the entire DLC film is 100 atomic %. According to the Patent Document 3, it describes that the additive agent contained in the lubricant oil is easy to be adsorbed in the front surface of DLC film containing relatively large amount of oxygen together with the metal element. However, if the amount of oxygen is large, the network structure of the DLC film may be broken and the hardness becomes soft to thereby drop the wear resistance. According to the low friction sliding member of the present invention, the low friction property is achieved by forming a boundary layer generated by selective adsorption of the additive derived negative ions on the surface of the DLC film or by the reaction therewith. This low friction generation mechanism is different from the conventional mechanism and therefore the DLC film according to the invention may not contain oxygen (O).

It is preferable to define the surface roughness (Ra) of DLC film to be equal to or less than 0.05 μm or more preferably, equal to or less than 0.02 μm or equal to or less than 0.01 μm according to the arithmetic average roughness (Ra) defined by JIS B 0031, published in 1994. If the roughness (Ra) exceeds 0.05 μm, the increase of lubrication ratio by the lubricant oil may not be expected and it becomes more difficult to reduce the coefficient of friction. On the other hand, if the value of roughness (Ra) is very small, the adsorption on the surface of the DLC film becomes difficult to be achieved even if the additive such as sulfur (S) or phosphorus (P) is included in the lubricant oil. Accordingly, it is preferable to set the value of surface roughness (Ra) to be equal to or more than 0.004 μm or further 0.005 μm or more in addition to the above upper limits.

The hardness of DLC film is not particularly designated, but considering the wear resistance or the like, it is preferable to set to be equal to or more than 12 GPa, or equal to or more than 13 GPa, 14 GPa or further preferable to be equal to or more than 15 GPa. However, if the DLC film is very hard, the film may be broken or peeled off and therefore, if the upper limit of the hardness is defined, it may be preferably equal to or less than 35 GPa, or may be equal to or less than 32 GPa, or further preferably 30 GPa or less. The coefficient of elasticity of the DLC film is not particularly limited however, considering the wear resistance or the like, the coefficient of elasticity is preferably equal to or more than 100 GPa, 115 GPa, or 130 GPa. If the coefficient of elasticity is very high, the film may be broken or peeled off and therefore, if the upper limit of the hardness is defined, it may be preferably equal to or less than 300 GPa, or may be equal to or less than 280 GPa, or further preferably 250 GPa or less. In this specification, as the values of hardness and coefficient of elasticity, the measurement values measured by nanoindenter test machine ("Triboscope" produced by HYSITRON Corp.) are adopted. From the point of durability, it is preferable to have a thicker DLC film and it is desirable to set the thickness to 0.5 to 7 μm or 1 to 3 μm.

<Lubricant Oil>

The low friction sliding member according to the present invention is used under a wet condition using lubricant oil. The lubricant oil does not contain molybdenum (Mo), but includes at least one of sulfur (S) and phosphorus (P) and at least one of zinc (Zn), calcium (Ca), magnesium (Mg), sodium (Na), barium (Ba) and copper (Cu). These elements are included in the additive added to the base oil. As the main additive, alkaline earth metal system additive, such as Ca-sulfonate, Mg-sulfonate, Ba-sulfonate, or Na-sulfonate, or extreme pressure additive, such as ester phosphate, phosphite ester, zinc-dialkyldithiophosphate (Zn-DTP), will be applied. Further, other additives which do not include the above elements may be used, for example, ashless dispersant agent, such as succinimide or succinic acid ester. In other words, various negative ions are adsorbed or react on the surface of the low friction sliding member according to the invention to form the boundary layer. Such negative ions adsorbed or react are, for example, $S^-$, $PO_2^-$, $PO_3^-$, $SO_2^-$, $SO_3^-$, $PO_2S^-$, $PSO_2^-$, $CNO^-$ and so on. The lubricant oil may only be supplied at least to the sliding surface upon sliding movement of the low friction sliding member formed with the DLC film according to the present invention.

The percent by mass of at least one of sulfur (S) and phosphorus (P) and at least one of zinc (Zn), calcium (Ca), magnesium (Mg), sodium (Na), barium (Ba) and copper (Cu) preferably exceeds 500 ppm (0.05% by mass), assuming that the total percent by mass of the lubricant oil is 100 mass %. The inventors of this application pin-pointed the fact that the preferential adsorption and reaction of the negative ions to the surface of the DLC film can achieve the friction reduction effect, not only by merely containing the elements (the group of S and P) that form the negative ions in the lubricant oil, but also at the same time by containing the elements (the group of Zn, Ca, Mg, Na, Ba and Cu) that form the positive ions. As long as the total amount by mass of these elements is at least 500 ppm, the friction reduction effect can be achieved without containing molybdenum in the lubricant oil. It should be noted that the elements are added to the base oil as compounds, but each contained amount defined in the specification is based on the element converted value, assuming that the total mass percent of the lubricant oil is 100 mass %. As for the base oil, normally vegetable oil, mineral oil or synthetic oil may be applicable. It is desirable not to contain any molybdenum at all in the lubricant oil (0 ppm), however, if the total lubricant oil is assumed to be 100% by mass, 10 ppm or less of the molybdenum containment may be allowable as the unavoidable impure substances.

In detail, as the lubricant oil, ATF (Automatic Transmission Fluid), CVTF (Continually Variable Transmission Fluid), gear oil as power train system oil, fuel oil such as gasoline, light oil, engine oil are applicable. Among these, molybdenum compound may be sometimes added as an extreme pressure agent or the like. This invention is limited to the lubricant oil without containing such Mo component.

In conventional lubricant oil containing molybdenum as an additive, the friction can be reduced by forming $MoS_2$ (molybdenum sulfide) film on the sliding surface by molybdenum and sulfur contained in the lubricant oil upon movement. However, it is said that the $MoS_2$ (molybdenum sulfide) film formed upon sliding movement in the lubricant oil containing molybdenum compound has friction reduction effect under the lubricant oil temperature of about 80 to 100° C. and does not show any effect on the friction reduction under the lubricant oil temperature of 80° C. or less. Film forming mechanism of the boundary layer which is the factor or the cause of friction reduction according to the low friction sliding member of the present invention is quite different from the film forming mechanism of $MoS_2$ film formed in the lubricant oil containing molybdenum compound. Because of this fact, the low friction sliding member of the present invention may have the possibility of expressing the friction reduction effect even the temperature of the lubricant oil is less than 80° C. In some cases of the low friction sliding member according to the present invention, in which the DLC film contains molybdenum, molybdenum compound, such as $MoS_2$ film is formed on the DLC film surface upon sliding movement. This $MoS_2$ film is, as explained in detail, formed by a film forming mechanism different from the $MoS_2$ film formed in the lubricant oil containing molybdenum compound. For this reason, the low friction sliding member having the DLC film containing molybdenum according to the present invention may have the friction reduction effect even under the lubricant oil temperature of 80° C. or less.

<Manufacturing Method for Low Friction Sliding Member>

The DLC film explained above is preferably made by various sputtering deposition processes, and especially among magnetron sputtering methods, unbalanced magnetron sputtering method (UBMS) is preferably used for forming the DLC film. UBMS method is a method in which ion incident to a processed material (substrate) is strengthened by intentionally breaking the balance of magnetic field, to which the target is applied. Ionization of the material gas is promoted and at the same time the reaction thereof is promoted by the electrons trapped in the magnetic field lines extending from the vicinity of target evaporation front to the vicinity of substrate. In addition, since ion incident to the substrate is increased, dense DLC film can effectively be formed.

When the low friction sliding member according to the present invention is manufactured by the UBMS method, target containing carbon (C), as the carbon source, target containing boron (B), target containing aluminum (Al), target containing manganese (Mn) and target containing molybdenum (Mo), as the additive source are used. Further, as the processing gases, noble gas as a sputter gas and hydrogen containing gas as the hydrogen source gas are introduced into the reacting chamber. As carbon containing target, graphite target (preferably the purity of 99.9% or more) is preferable. As the boron containing target, aluminum containing target, manganese containing target and molybdenum containing target, each elementary substance (preferably the purity of 99.9% or more) or carbide target is preferable. As the sputtering gas, one of the noble gases may be chosen, for example, at least one from argon (Ar) gas, helium (He) gas and nitrogen ($N_2$) gas. As the hydrogen containing gas, among hydrocarbon system gas, at least one of the methane ($CH_4$), acetylene ($C_2H_2$) and benzene ($C_6H_6$) can be chosen and in order to prevent oxidization of the DLC film, hydrogen gas ($H_2$) may be introduced together with the hydrocarbon system gas. The flow rate of these gases may be set to 200 to 500 sccm for noble gas, 10 to 25 sccm for hydrocarbon system gas. In addition to the noble gas and the hydrocarbon system gas, oxygen containing amount in the film can be reduced and introduction of impurity substances into the film can be prevented by introducing hydrogen gas ($H_2$) of 1 sccm or more, and further, 10 to 25 sccm. It is noted that the unit "sccm" means the flow rate under the atmospheric pressure level (1013 hPa) and under the room temperature condition.

In order to reduce the oxygen mixing into the DLC film, the chamber is evacuated to the pressure of $10^{-5}$ Pa before film forming. Further, as a pre-processing, hydrogen gas is introduced into the chamber to greatly reduce the oxygen (O) and the water remained in the chamber. As stated above, by introducing the hydrogen gas ($H_2$) upon film forming process, the oxygen containing amount can be further reduced. On the other hand, the hydrogen containing amount is increased due to these processes. As the hydrogen amount increases, the hardness of the DLC film tends to be reduced and accordingly, it is desirable to control the hydrogen introduction amount depending on the physicality of the DLC film.

The structure of the DLC film to be formed is influenced by the film forming temperature. Boron (B), aluminum (Al) and manganese (Mn) are difficult to form carbide and therefore, the film forming temperature is preferably set to 300° C. or less or further, set to be 150 to 250° C. to obtain a DLC film, which substantially does not contain carbide, and which has a low orientation. Molybdenum (Mo) is easier to form carbide compared to boron (B) and accordingly by forming the film under the temperature set above, a DLC film containing molybdenum (Mo) including small carbide can be obtained. It should be noted that the film forming temperature is the surface temperature of the substrate in the film forming and can be detected or measured by a thermocouple or heat radiator thermometer.

Further, the structure of DLC film receives influence on bias voltage of the substrate which decides the ion incident energy amount. Boron (B), aluminum (Al) and manganese (Mn) are difficult to form carbide but by the influence of the bias voltage, the carbide is easy to be formed and therefore, the bias voltage to be applied to the substrate is preferably set to be the negative voltage of 100 to 500V. Molybdenum (Mo) is easier to form carbide compared to boron (B) and accordingly by forming the film within the bias voltage set above, a DLC film containing molybdenum (Mo) including small carbide can be obtained.

The processing gas pressure is preferably set to be 0.5 to 1.5 Pa and the electric power to be applied to the target is preferably set to be 1 to 3 kW and the strength of magnetic field in the vicinity of substrate is set to be 6 to 10 mT.

The molybdenum containing target, aluminum containing target and manganese containing target are easily sputtered. However, the boron containing target is hard to be sputtered. It is necessary to optimize the output and magnetic field strength when controlling the containing amount of B, Mo, Al or Mn.

As explained above, arc ion plating method (AIP) can be used for manufacturing the DLC film in addition to the UBMS method. The AIP method is the method for forming a DLC film on the surface of the substrate by reacting carbon (C), boron (B) and so forth with the processing gas introduced into the reaction chamber, and C, B and so forth which have been evaporated from each target by arc discharging in the vacuum through high current (40 to 80 A).

As explained above, the various aspects of the low friction sliding members according to the invention have been explained and the invention which is intended to be protected is not to be construed as limited to the particular aspects and examples disclosed. Further, the embodiments and examples described herein are to be regarded as illustrative rather than restrictive. Variations and changes may be made by others, and equivalents employed, without departing from the subject matter of the present invention.

It is possible to consider that the present invention is characterized in the sliding method for sliding the low friction sliding member with the mating material in the lubricant oil without containing the molybdenum.

The invention will be explained in more detail according to the examples of the low friction sliding member according to the invention.

EXAMPLES

Based on the aspects of the invention explained above, various amorphous carbon films were formed on the surface of the substrate and the sliding members were produced. The sliding testing was conducted for respective sliding members using two different lubricant oils and evaluated each member on its sliding property. The sliding test and the evaluation of the sliding property will be explained hereinafter.
<Substrate>

As the substrate, steel (martensitic stainless steel: SUS440C) was prepared. The size (dimension) of the material is 6.3 mm×15.7 mm×10.1 mm and surface hardness thereof is HRC60, surface roughness (Ra) is 0.005 µm.
<Film Forming of Amorphous Carbon>

Amorphous carbon films, each having different kind of additive elements and different contained amounts thereof were formed on the surface of the substrate using the unbalanced magnetron sputtering device ("UBMS504" produced by Kobe Steel Corp.). The substrate was placed inside the device and graphite target and additive element targets each having its elementary substance (for example, if the additive is boron, then pure boron target, and if the additive is aluminum, then pure aluminum target) were arranged one by one on the magnetrons attached to the device. The surface of the target was placed opposing to the film forming surface of the substrate. The distance between the substrate surface and the target surface was set to be 100 to 800 mm. The magnetron was placed rear side of each target to form outside magnetic pole (strong magnetic field) and inside magnetic pole (weak magnetic field). The two magnetic fields are intentionally imbalanced (at non-equilibrium state magnetic field) and by this imbalance, a portion of the magnetic line from the outside magnetic field extends up to the substrate and a portion of plasma can be diffused along the magnetic line up in the vicinity of substrate.
<Forming the Intermediate Layer>

The inside of the device was evacuated and pure chrome target was sputtered by the argon gas to form a chrome film of columnar crystal on the surface of the substrate. Further, the methane gas $CH_4$ was introduced to form a Cr—C film on the surface of the chrome film. Thus the intermediate layer having the total thickness of 0.8 µm was formed.
<Forming the DLC Film>

The device was evacuated to the level of $1 \times 10^{-5}$ Pa and then 200 sccm argon gas, 10 sccm methane gas ($CH_4$) and 1 sccm hydrogen ($H_2$) gas were introduced. The gas pressure inside the device was 0.7 Pa. Then, using the electric source device, 2.5 kW electricity was applied to the graphite target and 1.0 to 2.5 kW electricity depending on the amount of additive was applied to the additive element containing targets and plasma discharge was carried out to the targets. The condition of film forming was: Bias Voltage to the substrate; −100V, Film forming temperature (surface temperature of the substrate); 200° C., Film forming time; 120 minutes. Thus a DLC film thickness of which is 1.5 µm was formed on the surface of the intermediate layer.

According to the steps above, as the additive elements, a predetermined amount of boron containing DLC-B film, aluminum containing DLC-Al film, manganese containing DLC-Mn film and molybdenum containing DLC-Mo film were formed and samples #05, #06, #B1, #B2, #10, #18, #23 and #24 of the sliding members were obtained. Different amount of additive element containing DLC films, such as different amount boron containing DLC-B films, different amount aluminum containing DLC-Al films, different amount manganese containing DLC-Mn films and different amount molybdenum containing DLC-Mo films, and further, as the additive elements, magnesium containing DLC-Mg film, titanium containing DLC-Ti film, vanadium containing DLC-V film and nickel containing DLC-Ni film, and no additive element contained DLC film were formed and respective sliding members were obtained as the comparative examples. Note that, DLC-Si film containing silicon as the additive element was formed by method of direct-current plasma CVD film-forming.
<Film Forming and Mechanical Characteristics Measurement Thereof>

The sliding members (sample Nos. #00 to #24 and #B1 and #B2) were obtained according to the above steps. The composition of the respective DLC films, the surface hardness the coefficient of elasticity and the surface roughness of each of the sliding members were measured.

Hardness and the coefficient of elasticity of the DLC films were calculated based on the measurement values measured by the nano-indenter tester ("MTS" produced by TOYO TECHNICA Co., Ltd.). The surface roughness was measured by non-contact surface profiler, ("New Vision 5000" produced by ZYGO Corp.).

The contained amount of additive elements and the oxygen (O) in each DLC film were quantity-determined by various methods, namely, electron probe microanalysis (EPMA), X-ray photoelectron spectroscopy (XPS), Auger electron spectroscopy (AES) and Rutherford backscattering. The amount of hydrogen contained in the film was quantity-determined by elastic recoil detection analysis (ERDA). ERDA method contains the steps of irradiating helium ion beam of 2 MeV to the film surface, detecting the hydrogen scattered from the film by semiconductor detector and measuring the hydrogen concentration in the film. The result of the measurement is illustrated in the Table 1.

Figure 1:
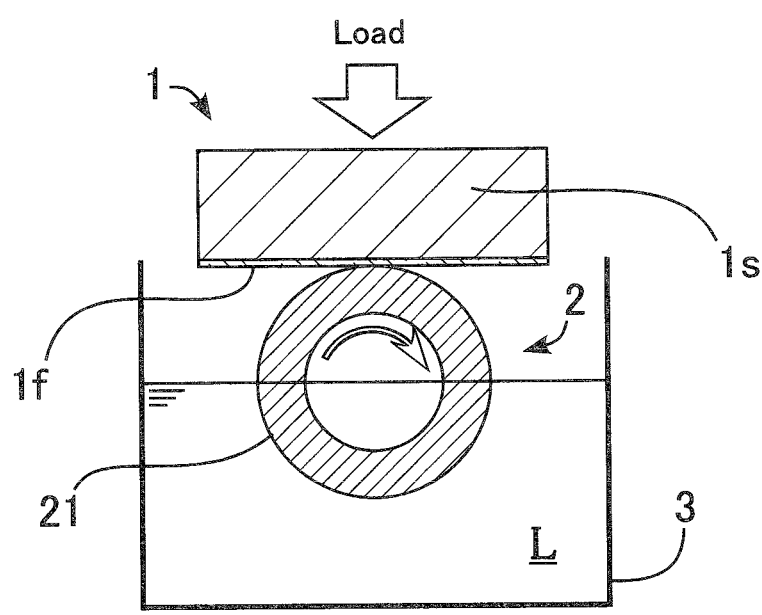

Table 1 was evaluated. FIG. 1 shows a block diagram of the block-on-ring type test machine. As shown in FIG. 1, the block-on-ring type test machine includes a block testing piece 1 and a ring testing piece 2 as a mating material. The block testing piece 1 is either one of the samples in the Table 1 and

TABLE 1

| Sample Nos. | DLC film | Composition (remaining: carbon) at % | | | hardness (GPa) | coefficient of elasticity (GPa) | surface roughness Ra (µm) |
|---|---|---|---|---|---|---|---|
| | | additive element | hydrogen | oxygen | | | |
| #00 | DLC | — | 20 | * | 25.7 | 195 | 0.013 |
| #01 | DLC-Si | 6.0 | 28 | 0.3 | 17 | 130 | 0.058 |
| #02 | DLC-B | 0.2 | 13 | * | 25.2 | 201 | 0.008 |
| #03 | DLC-B | 1.6 | 16 | * | 23.6 | 194 | 0.008 |
| #04 | DLC-B | 3.1 | 16 | <0.1 | 20.9 | 179 | 0.007 |
| #05 | DLC-B | 4.4 | 19 | <0.1 | 18.6 | 158 | 0.006 |
| #06 | DLC-B | 6.4 | 21 | <0.1 | 15.4 | 138 | 0.009 |
| #07 | DLC-Mg | 10.5 | 16 | 0.5 | 9.9 | 108 | 0.012 |
| #08 | DLC-Mg | 20.0 | 13 | 1.5 | 7.3 | 147 | 0.014 |
| #09 | DLC-Al | 4.8 | 17 | * | 19.8 | 177 | 0.014 |
| #10 | DLC-Al | 13.9 | 15 | * | 14.6 | 153 | 0.008 |
| #11 | DLC-Al | 22.6 | 11 | 0.6 | 12 | 154 | 0.007 |
| #12 | DLC-Ti | 2.4 | 20 | * | 21.3 | 180 | 0.007 |
| #13 | DLC-Ti | 6.3 | 16 | * | 17 | 161 | 0.012 |
| #14 | DLC-Ti | 11.9 | 12 | <0.1 | 14.9 | 162 | 0.009 |
| #15 | DLC-Ti | 20.6 | 9 | <0.1 | 14.7 | 158 | 0.011 |
| #16 | DLC-V | 9.4 | 16 | 0.5 | 15.7 | 152 | 0.009 |
| #17 | DLC-V | 20.6 | 12 | 1.5 | 15.3 | 144 | 0.014 |
| #18 | DLC-Mn | 13.7 | 18 | <0.1 | 17.9 | 156 | 0.012 |
| #19 | DLC-Mn | 28.1 | 14 | <0.1 | 13.2 | 148 | 0.011 |
| #20 | DLC-Ni | 16.0 | 13 | * | 16.5 | 167.4 | 0.011 |
| #21 | DLC-Ni | 29.2 | 11 | * | 14.3 | 157 | 0.008 |
| #22 | DLC-Mo | 5.3 | 11 | <0.1 | 19.6 | 186 | 0.006 |
| #23 | DLC-Mo | 10.7 | 16 | * | 19.1 | 183 | 0.01 |
| #24 | DLC-Mo | 19.8 | 13 | * | 18.2 | 187 | 0.01 |
| #B1 | DLC-B | 12.1 | 18 | * | 17 | 143 | 0.008 |
| #B2 | DLC-B | 14.9 | 16 | * | 14.8 | 129 | 0.009 |

In the Table 1, column, not showing value and marked as "*" means that any of the DLC film in these columns substantially do not contain oxygen and even if contained, the amount was less than three atomic %. In more detail, when the additive element was equal to or less than 15 atomic %, the oxygen contained amount was 0.8 atomic % or less and even the additive element exceeds 16 atomic %, the oxygen contained amount was equal to or less than 2%. It should be noted here that in the Table 1, the symbol "<0.1" means that the oxygen is included only the amount of analytical sensibility. It means that the oxygen is contained less than 0.1 atomic %.

The DLC film #00, which does not contain additive element, includes 20 atomic % hydrogen, but the film was very hard. In the samples (#01 to #24, #B1 and #B2) including additive elements, the hardness of each of the DLC films was soft, softer than that of the DLC film of sample #00. The table indicates that more the amount of additive elements, the less the hardness thereof becomes. The coefficient of elasticity has the same tendency.

The hardness and the coefficient of elasticity of the DLC film containing boron was easy to be affected by the amount of additive element compared to the other additive elements. Form the point of wear resistance, the boron containing amount of DLC-B film was set to be the value equal to or less than 13 atomic %. Then the hardness of the film was kept to the value of 15 GPa or more.

<Measurement of Coefficient of Friction>

Friction test was conducted by the block-on-ring type friction test machine ("LFW-1" produced by FALEX Corp.) and the friction property of each sample (#00 to #24) listed in the each includes a substrate "1s" and a film "1f". The ring testing piece 2 is made from a carburized SAE4620 steel and has a ring shape of the outer diameter φ: 35 mm, width: 8.8 mm (average surface roughness of the outer peripheral surface Rz being 1.3 µm average at ten points on the outer peripheral surface). The ring testing piece 2 is provided so that the outer periphery 21 thereof is in contact with the surface of film 1f of the block testing piece 1.

The ring testing piece 2 was rotated in an arrow direction as viewed in FIG. 1 under the block testing piece 1 being pushed to the ring testing piece 2 with the load 130N (maximum Hertz surface pressure: 210 MPa). The rotation speed was 160 rpm (0.3 m/sec.). The ring testing piece 2 was placed in the oil tank 3 in which oil "L" (80° C.) was approximately half filled. When the ring testing piece 2 was rotated, lubricant oil was supplied to the sliding portion with the block testing piece 1. Thus the block testing piece 1 and the ring testing piece 2 were in sliding movement for 30 minutes and the coefficient of friction was measured immediately before the test was completed.

As the lubricant oil, (1) engine oil without containing molybdenum and (2) base oil without any additives (mineral lubrication oil with no additives) were used. Viscosity grade of both oils were 5W-30 graded. The engine oil (1) contains Ca-sulfonate, Zn-DTP and succinimide as the additives. From the analysis result of metal component in oil and composition data obtained from the lubricant oil manufacturer, the total of 500 ppm of sulfur, phosphorus, zinc and calcium were confirmed to be contained. This value was a converted value to the elements assuming that the total engine oil is 100% by mass. Hereinafter the lubricant oil (1) is called as "engine oil" and the lubricant oil (2) as "base oil".

Figure 2:
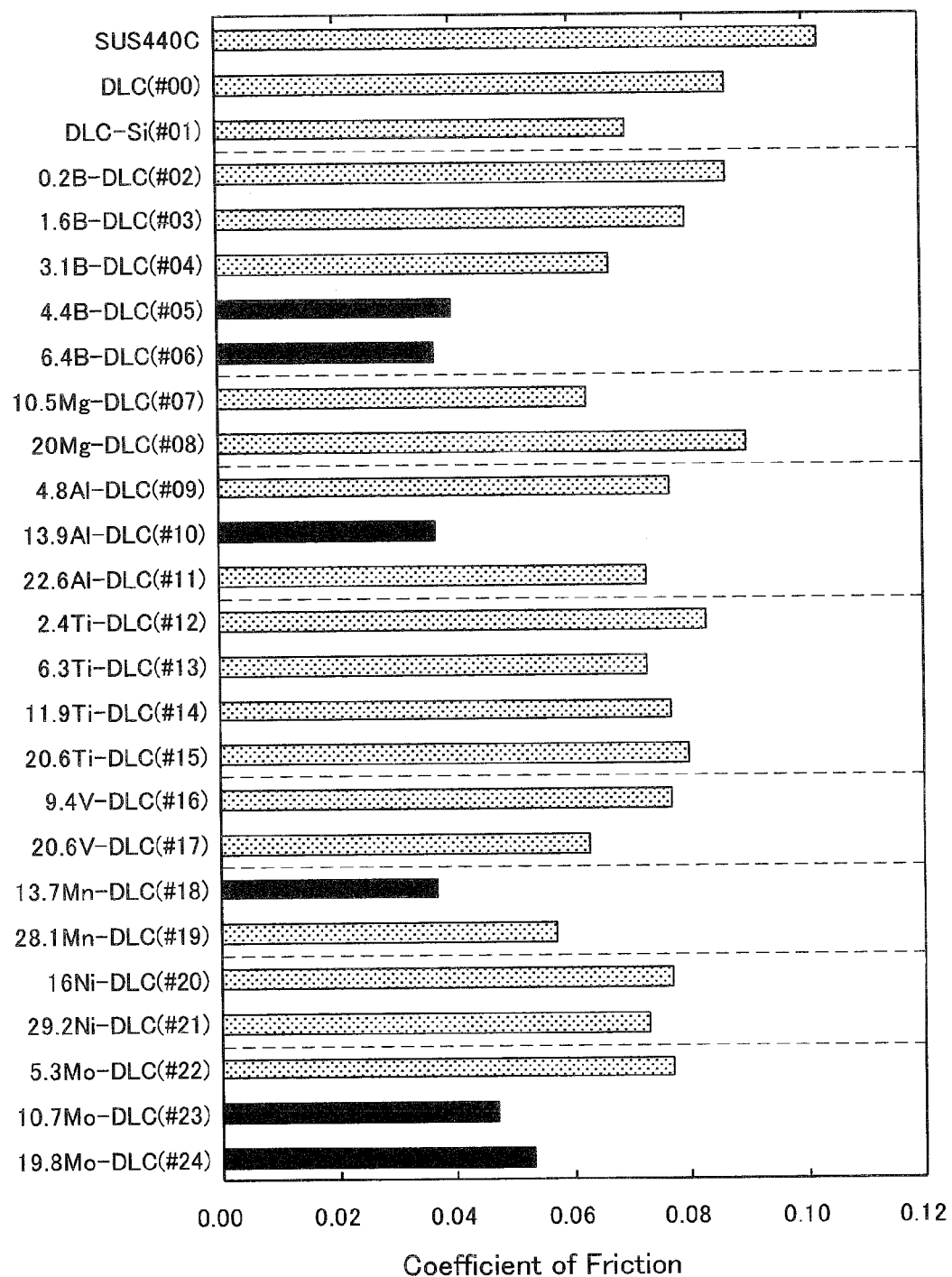
FIG. 2 is a graph showing the measurement result of the coefficient of friction tested by the friction test machine on various low friction sliding members used in the engine oil containing no molybdenum.

As shown in FIG. 2, friction test result (coefficient of friction) of the samples #01 to #24 and the substrate (SUS440C) tested in the engine oil was shown. In the engine oil without containing molybdenum, the coefficient of friction of the substrate (SUS440C) without forming a film was relatively high, exceeding the value of 0.1. By forming various films on the substrate (SUS440C), the coefficient of friction dropped. Further, the samples #01 to #24 having a DLC film containing additive element indicated the same or less value of coefficient of friction with the sample #00 having DLC film with carbon and hydrogen.

The samples #07 and #08 having DLC-Mg film, the samples #12 to #15 having DLC-Ti film, the samples #16 and #17 having DLC-V film or the samples #20 and #21 having DLC-Ni film showed any particular change even the amount of additive was changed. However, the samples #05 and #06 among the samples #02 to #06 having DLC-B film showed a very small value of coefficient of friction. Among the samples #09 to #11 having DLC-Al film, the sample #10 showed a very small value of coefficient of friction. The sample #18 having DLC-Mn film containing 13.7 atomic % manganese (Mn) showed a smaller value of coefficient of friction than the sample #19 having DLC-Mn containing 28.1 atomic % manganese (Mn). Among the samples #22 to #24 having DLC-Mo film, the samples #23 and #24 showed smaller values of coefficient of friction and the sample #23 containing 10.7 atomic % molybdenum (Mo) showed particularly small value of the coefficient of friction.

Figure 3:
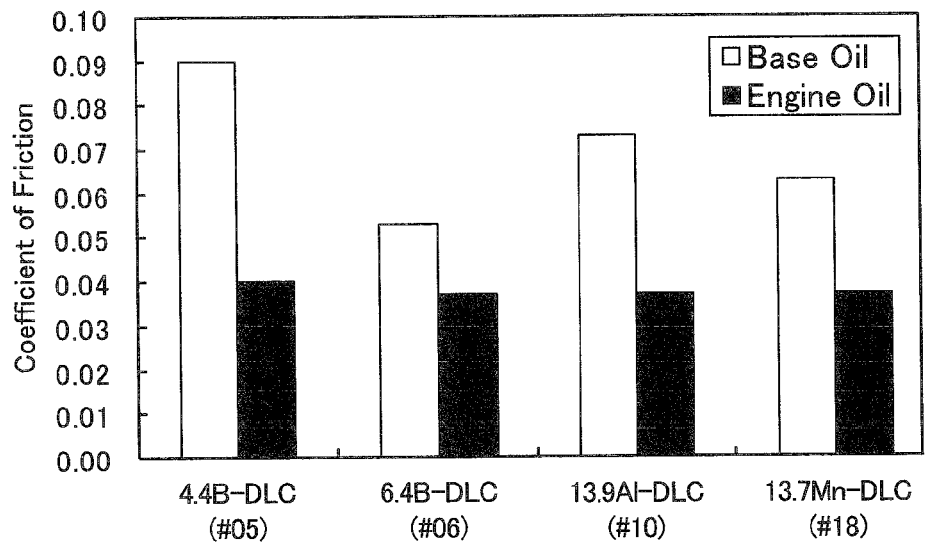
FIG. 3 is a graph showing the measurement result of the coefficient of friction tested by the friction test machine on various low friction sliding members according to the invention, used in the base oil or in the engine oil containing no molybdenum.
Figure 4:
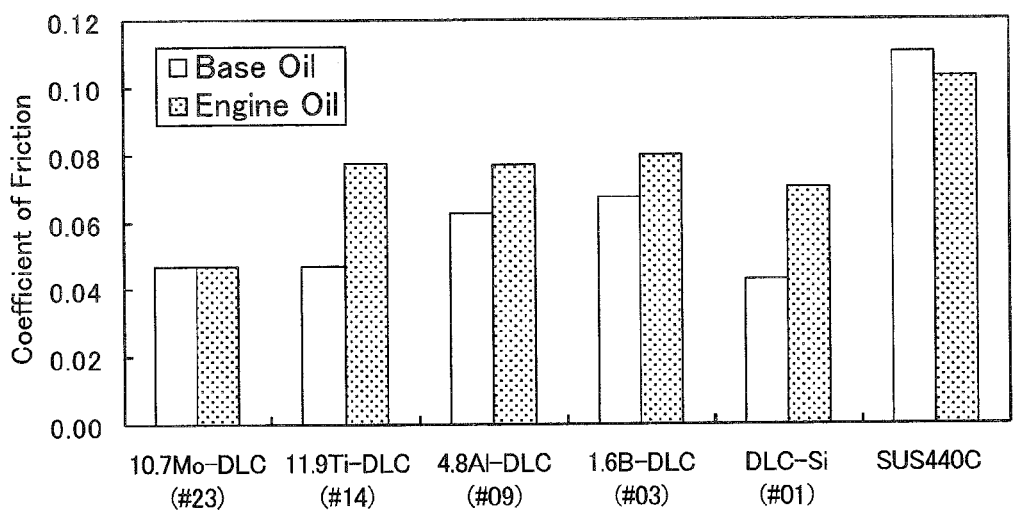
FIG. 4 is a graph showing the measurement result of the coefficient of friction tested by the friction test machine on various sliding members used in the base oil or in the engine oil containing no molybdenum.

The samples #05, #06, #10 and #18 showed very small values of coefficient of friction in the engine oil were tested also in the base oil and the result (coefficient of friction) of testing was shown in FIG. 3 together with the test result in the engine oil. In all samples, the value of the coefficient of friction was smaller tested in the engine oil than the value of the coefficient of friction tested in the base oil. In FIG. 4, the testing result (coefficient of friction) of the substrate (SUS440C) and samples #01, #03, #09 #14 and #23 in the base oil was shown together with the testing result thereof in the engine oil. The values of the coefficient of friction in the samples #01 and #14 were smaller tested in the base oil than those of the coefficient of friction tested in the engine oil. Similarly, the values of coefficient of friction in the samples #03 and #09 were smaller when tested in the base oil than when tested in the engine oil. The testing results shown in FIGS. 3 and 4 suggest that the mechanism of friction reduction is different between the low friction sliding members according to the present invention having the DLC films containing boron (B), aluminum (Al) or manganese (Mn) contained therein with a predetermined ratio relative to the total amount of the DLC film shown in FIG. 3 and the sliding members having the other DLC films shown in FIG. 4.

<Surface Analysis of Amorphous Carbon Film after Friction Test>

In order to study the factors of boundary friction reduction, the inventors analyzed the adsorbed substances on the surfaces of the samples #00, #01, #03, #06, #B1, #10, #13 and #23 and the substrate (SUS400C) after the friction testing in the engine oil. The analysis was made by secondary ion mass spectrometry method (TOF-SIMS). The analysis results of each adsorbed substances in the samples and substrate are shown in FIGS. 5 through 12. In each drawing, the area enclosed by a dotted line corresponds to the sliding portion making a sliding contact with the ring testing piece. It is noted here that the values indicated in parentheses followed by each component name in FIGS. 5 through 11 and the value indicated below at the left side of Photo in FIG. 12 represent the contained percent by mass of each component assuming that the measured total surface area is set to be 100% by mass. However, each component is largely seen in the brighter portion and accordingly, the percent by mass of each component seen only on the sliding surface area is different from the values indicated in the drawings.

FIG. 11 shows the surface analysis result of the substrate after the friction test and components $Ca^+$, $Zn^+$, $S^-$ and $PO_2^-$ were largely detected. This is because inorganic layer (FeS) was formed on the surface of stainless steel (substrate) and $Ca^+$, $Zn^+$, $S^-$ and $PO_2^-$ were adsorbed thereon. The inorganic layer improves the anti-adhesion effect to obtain thereby a stable coefficient of friction. However, the coefficient of friction of the substrate without having DLC film on the surface exceeded the value of 0.1. These results suggest that due to the shearing force of the inorganic layer, friction reduction effect could not be obtained by the boundary layer formed by the adsorbed substances.

Figure 6:
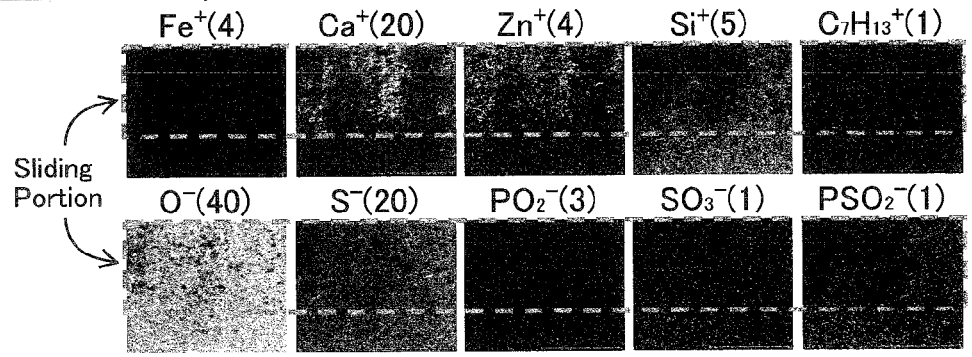
FIG. 6 shows an analysis result of the adsorbed material adsorbed on the surface of the sliding portion after the sliding member having DLC film containing silicon was tested in the engine oil by the friction test machine.
Figure 9:
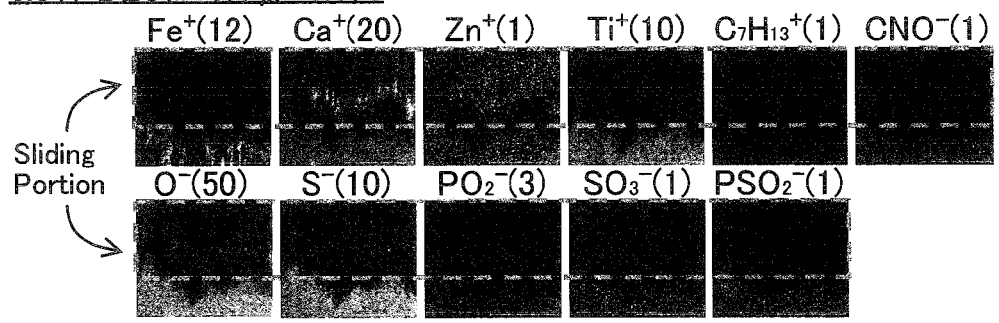
FIG. 9 shows an analysis result of the adsorbed material adsorbed on the surface of the sliding portion after the sliding member having DLC film containing titanium was tested in the engine oil by the friction test machine.

FIG. 6 shows the analysis result of the surface of DLC-Si film. In FIG. 6, the components $Ca^+$, $Zn^+$ and $S^-$ were largely detected. FIG. 9 shows the analysis result of the surface of 6.3 atomic % titanium contained Ti-DLC film. In FIG. 9, many $Ca^+$ components were detected. Since the positive ions were detected on the surface of these DLC films, the value of coefficient of friction became relatively high value of about 0.07.

Figure 7:
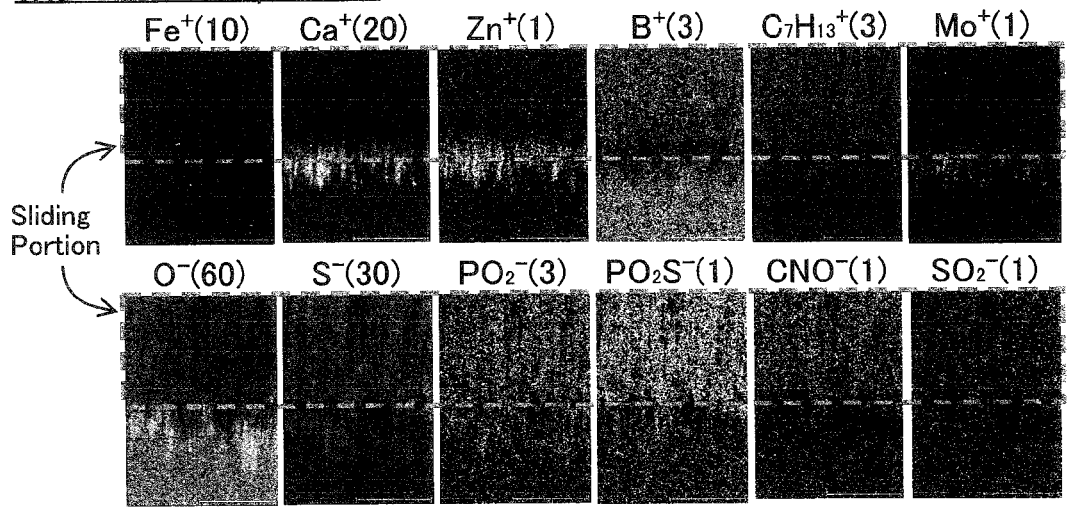
FIG. 7 shows an analysis result of the adsorbed material adsorbed on the surface of the sliding portion after the low friction sliding member having DLC film containing boron according to the present invention was tested in the engine oil by the friction test machine.
Figure 8:
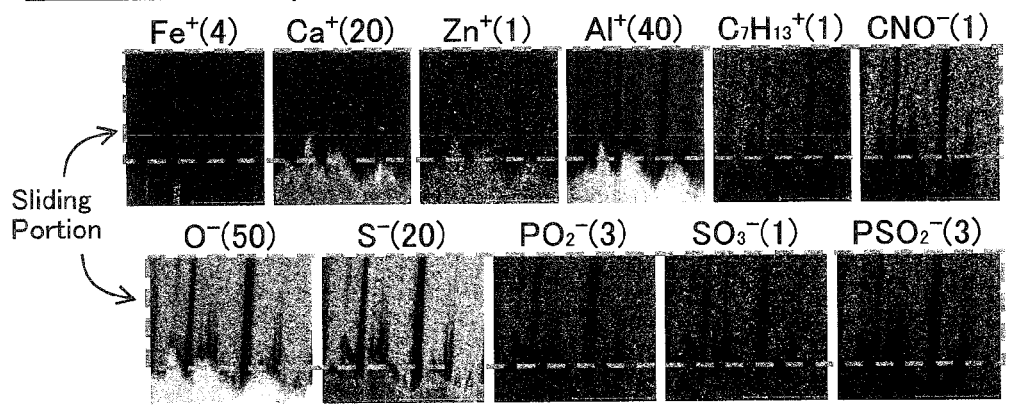
FIG. 8 shows an analysis result of the adsorbed material adsorbed on the surface of the sliding portion after the low friction sliding member having DLC film containing aluminum according to the present invention was tested in the engine oil by the friction test machine.

FIG. 7 shows the analysis result of the surface of 6.4 atomic % boron contained B-DLC film. FIG. 8 the analysis result of the surface of 13.9 atomic % aluminum contained Al-DLC film. In FIGS. 7 and 8, not so many components $Ca^+$ and $Zn^+$ were detected. This means that the surfaces of 6.4% B-DLC film and 13.9% Al-DLC film were not formed with the inorganic layer for adsorbing $Ca^+$ and $Zn^+$ components. However, many components $S^-$ and $PO_2^-$ were largely detected in both cases. According to more detailed analysis, components $PO_2S^-$, $SO_2^-$ and $CNO^-$ were largely detected on the surface of 6.4% B-DLC film and components $PSO_2^-$, $SO_3^-$ and $CNO^-$ were largely detected on the surface of 13.9% Al-DLC film. In other words, only the negative ions were selectively adsorbed or reacted on these film surfaces and the boundary layer formed thereby contributed to the low friction property in which the value of coefficient of friction is equal to or less than 0.04.

Figure 10:
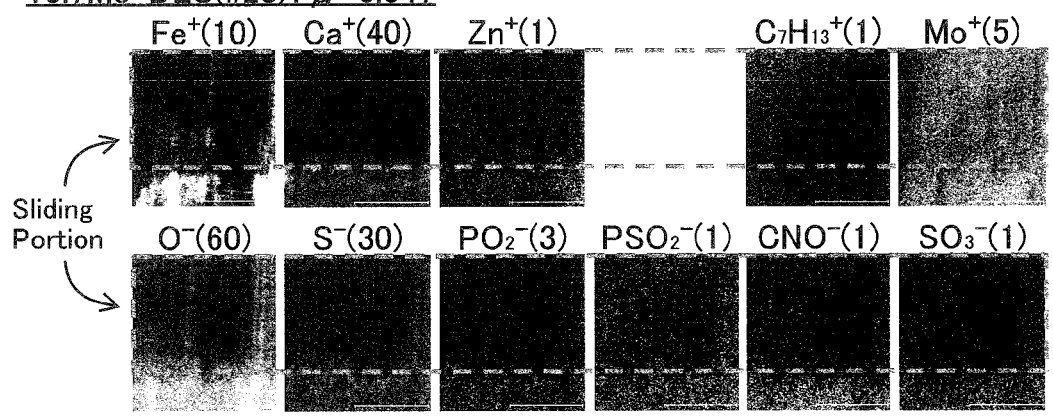
FIG. 10 shows an analysis result of the adsorbed material adsorbed on the surface of the sliding portion after the low friction sliding member having DLC film containing molybdenum according to the invention was tested in the engine oil by the friction test machine.
Figures 11, 12:
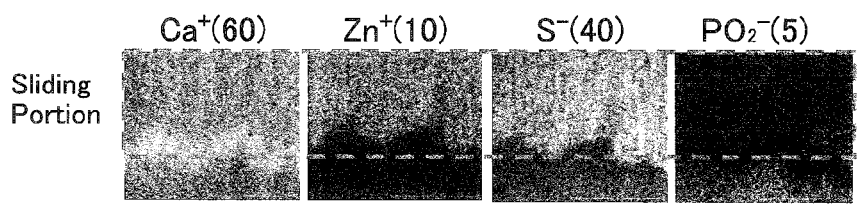
FIG. 11 shows an analysis result of the adsorbed material adsorbed on the surface of the sliding portion after the substrate made of stainless steel was tested in the engine oil by the friction test machine.
FIG. 12 shows an analysis result of the adsorbed material adsorbed on the surface of the sliding portion after the sliding members having DLC films, the boron contained amount of which is different from one another.

FIG. 10 shows the analysis result of 10.7Mo-DLC film surface. In FIG. 10, not so many $Ca^+$ and $Zn^+$ were detected. This means that positive ions such as $Ca^+$ and $Zn^+$ components were not adsorbed to the surface of 10.7% Mo-DLC film. However, on the other hand, many components $S^-$ and $PO_2^-$ were detected. Further, according to the X-ray photoelectron spectroscopy method (XPS), the generation of $MoS_2$ film on the 10.7% Mo-DLC film was detected. In other words, even the molybdenum compound is not contained in the lubricant oil, $MoS_2$ film can be generated on the surface of the DLC film containing a proper amount of molybdenum (Mo) upon sliding movement.

FIG. 12 summarizes the analysis results of B-DLC films in different containing amount of boron (B). The sample #03 in which both positive ($Ca^+$ and $Zn^+$) and negative ($S^-$ and $PO_2^-$) ions were detected showed a high value (0.08) of coefficient of friction. On the other hand, the detected positive ions were decreased and detected negative ions were largely seen in the samples #06 and #B1 compared to the detected ions of the sample #03. In the samples #06 and #B1, negative ions were selectively adsorbed and as the result, the value of coefficient of friction decreased. In other words, by properly adding the boron the negative ions were adsorbed or reacted on the surface of the film to form the boundary layer and improved the low friction.

Figure 5:
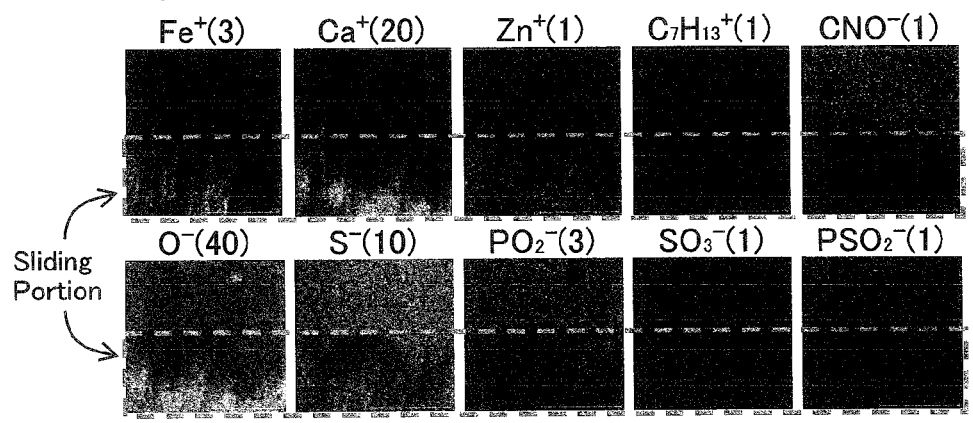
FIG. 5 shows an analysis result of the adsorbed material adsorbed on the surface of the sliding portion after the sliding member having DLC film comprised of carbon and hydrogen was tested in the engine oil by the friction test machine.

FIG. 5 shows the analysis result of the DLC film which does not contain any additive elements. In FIG. 5, not so many $Ca^+$ and $Zn^+$ were detected. Further, not so many components $S^-$ and $PO_2^-$ were detected either.

<Boron Contained Amount of B-DLC Film and the Coefficient of Friction>

Figure 13:
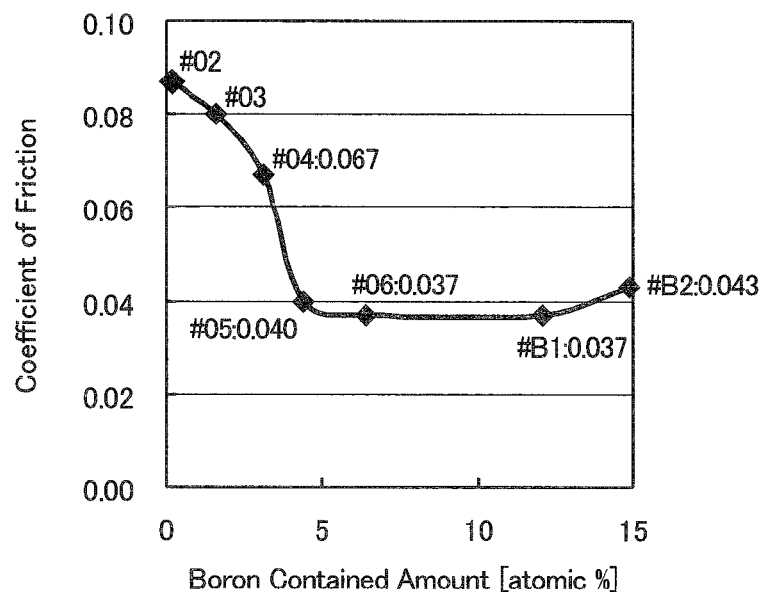
FIG. 13 is a graph showing a friction property of the sliding member having the DLC film containing boron and showing change of coefficient of friction relative to the boron containing amount.

The friction test was conducted on the samples #B1 and B2 having different boron contained amount B-DLC films similar to the friction test conducted on the samples #02 to #06 and the coefficient of friction was measured. The result was shown in FIG. 13.

In the range of boron containing amount between 4.4 atomic % and 13.5 atomic %, the value of coefficient of friction indicates equal to or less than 0.04. According to the surface analysis result shown in FIG. 12, if the boron contained amount is within this range, negative ions were selectively adsorbed or reacted on the film surface to form the boundary layer which can improve the low friction property.

<X-Ray Diffraction Measurement and Transmission Electron Microscope Observation>

Figure 14:
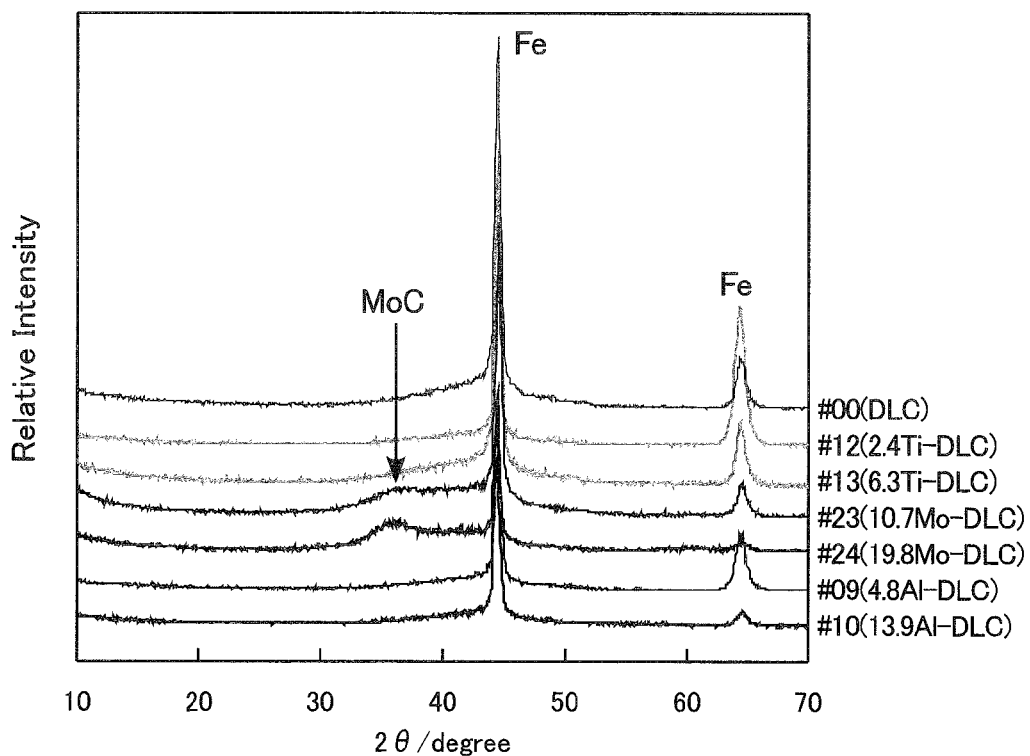
FIG. 14 shows a measurement result of the sliding member having various DLC films measured by X-ray diffraction (XRD)

XRD measurement was conducted for any one of the DLC films manufactured according to the steps above. Also, the DLC film structures of the samples #00, #06 and #13 were observed by TEM (transmission electron microscope). As TEM, "JEM-2010F" produced by Nihon Denshi Corp. (JEOL Ltd.) was used. FIG. 14 shows the measurement result of XRD and FIGS. 15 to 18 show the observation result and the analysis result of electron beam diffraction images by TEM.

Figure 16:
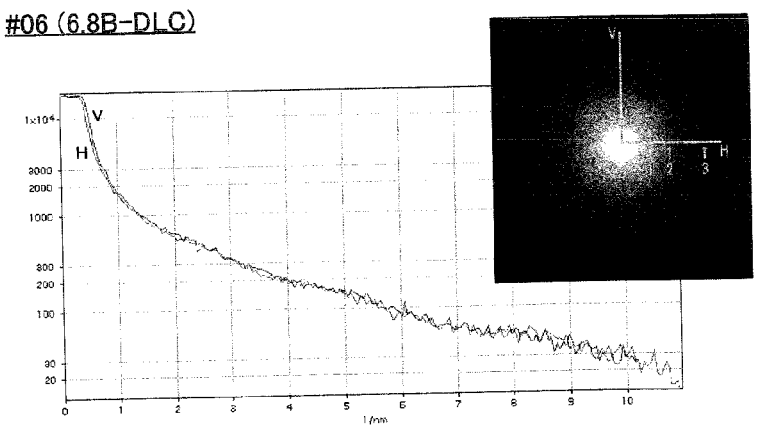
FIG. 16 shows an electron beam diffraction image obtained by TEM, observing the cross section of the low friction sliding member having DLC film containing boron according to the present invention and a graph showing the analysis result thereof.

The analysis method for electron beam diffraction image illustrated in FIGS. 16 through 18 will be explained. The electron beam diffraction image was obtained by irradiation of electron beam to the central portion of cross section of DLC film in a thickness direction. The intensity of thus obtained electron beam diffraction patterns was measured along two different directions (H and V in the drawings) corresponding to the radius of the diffraction ring by an analysis software. The measured results are shown in the drawings as a graph in which the horizontal axis indicates a distance (r) between the transmission wave and the diffraction wave (unit: $nm^{-1}$) and the vertical axis indicates the intensity. The interplanar spacing (d) of the graphite and TiC described in the JCPDS card were shown in FIG. 17 together with the respective PDF numbers. The distance "r" ($nm^{-1}$) and the interplanar spacing "d" (nm) have the relationship "$d=r^{-1}$" and accordingly, by identifying the interplanar spacing described in the JSPDS card, the belonging of a particular value of "d" to the diffraction ring can be confirmed.

As shown in FIG. 14, the peak point of iron (Fe) was detected from the substrate. From this, both films have the amorphous structure. However, in the samples #23 and #24 having a DLC film containing molybdenum (Mo), the diffraction line of MoC was confirmed and the generation of carbide was confirmed. It is noted that, although any drawing is not attached to the specification of this application, the existence of carbide was not confirmed by the XRD measurement of the samples having DLC film containing manganese or boron. In more detail, the samples having the DLC film containing boron, aluminum or manganese, which indicate particularly low coefficient of friction, were confirmed that the DLC film does not include carbide and have amorphous film with the element dispersed uniformly along the entire film.

Figure 15:
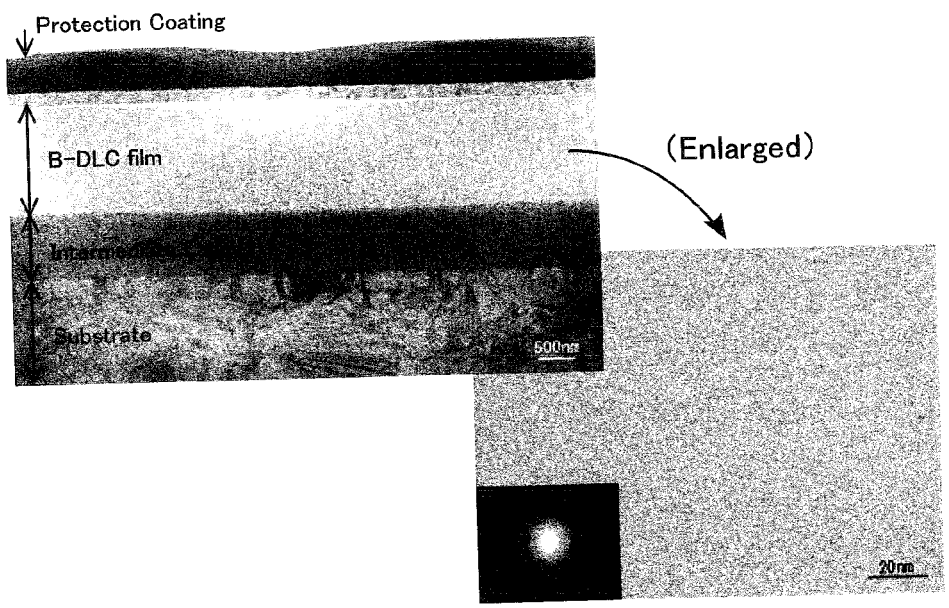
FIG. 15 shows an observation result of the cross section of the low friction sliding member having DLC film containing boron according to the present invention observed by transmission electron microscope (TEM).

Upper left portion of FIG. 15 shows the structure of sample #06 in cross section. The protection film formed on the surface of B-DLC film is an aluminum coating and tungsten coating formed for the purpose of making a sample for observing cross section by TEM. The lower right portion in FIG. 15 shows the observation result of the portion of B-DLC film with a higher magnification and also shows the electron beam diffraction patterns. No carbide was confirmed from any of the observations. Further, the graph shown in FIG. 16 indicates the analysis result by the electron beam diffraction image in FIG. 15, and from this graph in FIG. 16, the intensity becomes gradually decreased in accordance with the increase of value (r) in both H and V directions. The inventors confirmed that the B-DLC film does not contain carbide and does not have orientation because of no difference in intensity of electron beam diffraction patterns in both H and V directions.

For the purpose of comparison, the electron beam diffraction image and the analysis result thereof were shown in FIG. 17 relating to 6.3% Ti-DLC film in the sample #13. The intensity difference of electron beam diffraction patterns between the both directions V and H was confirmed around the point r=2.803 in the graph of FIG. 17. When the identification was made by the JCPDS card with the interplanar spacing value, this was confirmed to belong to the graphite (002) plane. Thus the Ti-DLC film was confirmed to have the orientation of graphite (002) plane. Further, at points "r=4.072", "r=4.601" and "r=6.452", the intensity fluctuation was confirmed. Those points correspond to the diffraction ring. When identified with the interplanar spacing described in the JCPDS card, these points respectively correspond to the TiC (111) (200) and (220) plane. This means that the Ti-DLC film contains fine particles of carbide. In other words, due to the existence of TiC, the Ti-DLC film is easy to be adsorbed by positive ions and due to the orientation of the amorphous structure, uniform adsorption of ions is prevented, and the friction reduction effect could not be achieved.

FIG. 18 shows the electron beam diffraction analysis image and the analysis result of the DLC film of sample #00. The DLC film is mostly composed of carbon (C) and hydrogen (H) and no additive element such as boron (B) was included. In FIG. 18, the intensity difference in electron beam diffraction patterns between V direction and H direction around the point "r=2.803" was confirmed. Accordingly, the DLC film has the orientation of graphite (002). The orientation performance was found to be reduced by adding boron (B), aluminum (Al) or manganese (Mn).

As thus explained, the low friction sliding member according to the present invention can achieve the low friction, i.e., improve the low friction by reducing the coefficient of friction to 0.06 or less, preferably to 0.05 or less further preferably to 0.04 or less, even under the wet oiling condition using a lubricant oil which does not contain molybdenum.

What is claimed is:

1. A low friction sliding member to be used under a wet condition, comprising:
    a substrate; and
    an amorphous hard carbon film farmed on a surface of the substrate and in sliding contact with a mating material, the amorphous hard carbon film being coated with a lubricant oil,
    wherein:
    the lubricant oil is free from molybdenum and includes at least one of zinc (Zn), calcium (Ca), magnesium (Mg), sodium (Na), barium (Ba), and copper (Cu) and at least one of sulfur (S) and phosphorus (P), and a total contained amount thereof exceeds 500 ppm;
    the amorphous hard carbon film comprises carbon (C) as a major component, hydrogen (H) in a range from 5 atomic % or more to 25 atomic % or less, oxygen (O) in an amount less than 0.1 atomic %, and boron (B) in a range from 4 atomic % or more to 30 atomic % or less assuming that a total atomic % of the amorphous carbon film is 100 atomic %;

at least one of $S^-$, $PO_2^-$, $PO_3^-$, $SO_2^-$, $PO_2S^-$, and $PSO_2^-$ is absorbed on a surface of the amorphous hard carbon film; and a coefficient of friction of the low friction sliding member is 0.06 or less.

2. The low friction sliding member according to claim 1, wherein the amorphous hard carbon film is substantially free from carbide.

3. The low friction sliding member according to claim 1, wherein a hardness of the amorphous hard carbon film is equal to or more than 12 GPa.

4. A sliding method comprising:
contacting slidably the low friction sliding member according to claim 1 with a mating member in the lubricant oil.

5. A low friction sliding member to be used under a wet condition, comprising:
a substrate; and
an amorphous hard carbon film formed on a surface of the substrate and in sliding contact with a mating material, the amorphous hard carbon film being coated with a lubricant oil, wherein:

the lubricant oil is free from molybdenum and includes at least one of zinc (Zn), calcium (Ca), magnesium (Mg), sodium (Na), barium (Ba), and copper (Cu) and at least one of sulfur (S) and phosphorus (P), and a total contained amount thereof exceeds 500 ppm;

the amorphous hard carbon film comprises carbon (C) as a major component, hydrogen (H) in a range from 10 atomic % or more to 25 atomic % or less, oxygen (O) in an amount less than 0.1 atomic %, and boron (B) in a range from 4 atomic % or more to 30 atomic % or less assuming that a total atomic % of the amorphous carbon film is 100 atomic %;

at least one of $S^-$, $PO_2^-$, $PO_3^-$, $SO_2^-$, $PO_2S^-$, and $PSO_2^-$ is absorbed on a surface of the amorphous hard carbon film; and a coefficient of friction of the low friction sliding member is 0.06 or less.

* * * * *

UNITED STATES PATENT AND TRADEMARK OFFICE
CERTIFICATE OF CORRECTION

| | |
|---|---|
| PATENT NO. | : 9,062,274 B2 |
| APPLICATION NO. | : 12/829809 |
| DATED | : June 23, 2015 |
| INVENTOR(S) | : Mori et al. |

It is certified that error appears in the above-identified patent and that said Letters Patent is hereby corrected as shown below:

In the claims:

Col. 18, line 55, Claim 1 change "farmed" to --formed--.

Signed and Sealed this
Twenty-ninth Day of September, 2015

Michelle K. Lee
*Director of the United States Patent and Trademark Office*